(12) United States Patent
Fukuda et al.

(10) Patent No.: US 8,957,447 B2
(45) Date of Patent: Feb. 17, 2015

(54) PHOSPHOR

(71) Applicant: Kabushiki Kaisha Toshiba, Minato-ku (JP)

(72) Inventors: Yumi Fukuda, Tokyo (JP); Masahiro Kato, Naka-gun (JP); Yasushi Hattori, Kawasaki (JP); Aoi Okada, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/187,686

(22) Filed: Feb. 24, 2014

(65) Prior Publication Data

US 2014/0339583 A1 Nov. 20, 2014

(30) Foreign Application Priority Data

May 15, 2013 (JP) ................................. 2013-103400

(51) Int. Cl.
*H01L 33/50* (2010.01)
*C09K 11/08* (2006.01)
*C09K 11/59* (2006.01)
*H01L 33/44* (2010.01)
*H01L 33/00* (2010.01)

(52) U.S. Cl.
CPC .............. *H01L 33/502* (2013.01); *H01L 33/44* (2013.01); *H01L 33/0095* (2013.01)
USPC ................ 257/98; 252/301.4 R; 252/301.4 F; 313/503

(58) Field of Classification Search
USPC ......... 257/98; 313/503; 252/301.4 R, 301.4 F
See application file for complete search history.

(56) References Cited

U.S. PATENT DOCUMENTS

| | | | | |
|---|---|---|---|---|
| 7,443,094 | B2* | 10/2008 | Sakane et al. | 313/503 |
| 7,816,663 | B2* | 10/2010 | Naum et al. | 257/13 |
| 7,887,718 | B2* | 2/2011 | Nagatomi et al. | 252/301.4 F |
| 7,887,719 | B2* | 2/2011 | Dong et al. | 252/301.4 F |
| 7,922,937 | B2* | 4/2011 | Li et al. | 252/301.4 F |
| 7,928,648 | B2* | 4/2011 | Jang et al. | 313/503 |
| 7,951,306 | B2* | 5/2011 | Tamaki et al. | 252/301.4 F |
| 7,951,307 | B2* | 5/2011 | Tamaki et al. | 252/301.4 F |

(Continued)

FOREIGN PATENT DOCUMENTS

| | | |
|---|---|---|
| JP | 2006-307090 | 11/2006 |
| WO | WO 2006/093298 A1 | 9/2006 |
| WO | WO 2007/037059 A1 | 4/2007 |

OTHER PUBLICATIONS

G. Blasse, et al., "Fluorescence of $Eu^{2+}$—Activated Silicates", Philips Res. Repts, 23, 1968, 12 pages.

(Continued)

*Primary Examiner* — Evan Pert
(74) *Attorney, Agent, or Firm* — Oblon, Spivak, McClelland, Maier & Neustadt, L.L.P.

(57) ABSTRACT

According to one embodiment, the phosphor exhibits a luminescence peak in a wavelength ranging from 500 to 600 nm when excited with light having an emission peak in a wavelength ranging from 250 to 500 nm. The phosphor has a composition represented by $(M_{1-x}Ce_x)_{2y}Al_zSi_{10-z}O_uN_w$ (M represents Sr and a part of Sr may be substituted by at least one selected from Ba, Ca, and Mg; x, y, z, u, and w satisfy $0<x\leq1$, $0.8\leq y\leq1.1$, $2\leq z\leq3.5$, $0<u\leq1$, $1.8\leq z-u$, and $13\leq u+w\leq15$). The phosphor has a crystalline aspect ratio of 1.5 to 10.

20 Claims, 7 Drawing Sheets

(56) References Cited

U.S. PATENT DOCUMENTS

| | | | |
|---|---|---|---|
| 8,178,002 B2* | 5/2012 | Camardello et al. | 252/301.6 F |
| 8,372,309 B2* | 2/2013 | Nagatomi et al. | 252/301.4 F |
| 8,378,568 B2* | 2/2013 | Sohn et al. | 313/503 |
| 8,414,796 B2* | 4/2013 | Tao et al. | 252/301.4 H |
| 8,475,683 B2* | 7/2013 | Li et al. | 252/301.4 R |
| 8,569,943 B2* | 10/2013 | Mitsuishi et al. | 313/483 |
| 8,574,459 B2* | 11/2013 | Seto et al. | 252/301.4 F |
| 8,603,361 B2* | 12/2013 | Fukuda et al. | 252/301.4 F |
| 8,685,277 B2* | 4/2014 | Fukuda et al. | 252/301.4 F |
| 2006/0197439 A1* | 9/2006 | Sakane et al. | 313/503 |
| 2006/0220520 A1* | 10/2006 | Sakane et al. | 313/487 |
| 2010/0164367 A1 | 7/2010 | Shioi et al. | |
| 2012/0086040 A1* | 4/2012 | Lee et al. | 257/98 |
| 2012/0104317 A1 | 5/2012 | Nagatomi et al. | |
| 2012/0119234 A1 | 5/2012 | Shioi et al. | |
| 2013/0241387 A1 | 9/2013 | Fukuda et al. | |

OTHER PUBLICATIONS

S.H.M. Poort, et al., "Optical properties of $Eu^{2+}$—activated orthosilicates and orthophosphates", Journal of Alloys and Compounds, 260, 1997, 5 pages.

T. Hahn, et al., International Tables for Crystallography, vol. A: Space-group symmetry, 1983, 2 pages.

Search Report dated Sep. 17, 2014, in European Application No. 14155376.8.

\* cited by examiner

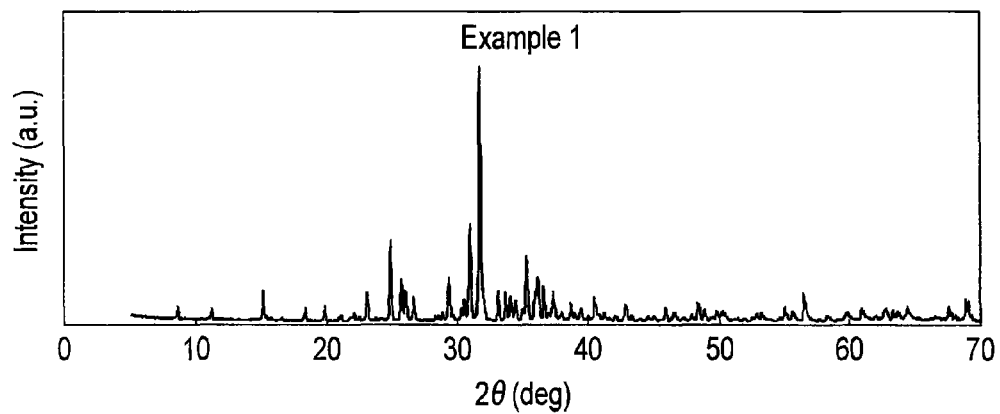
F I G. 4
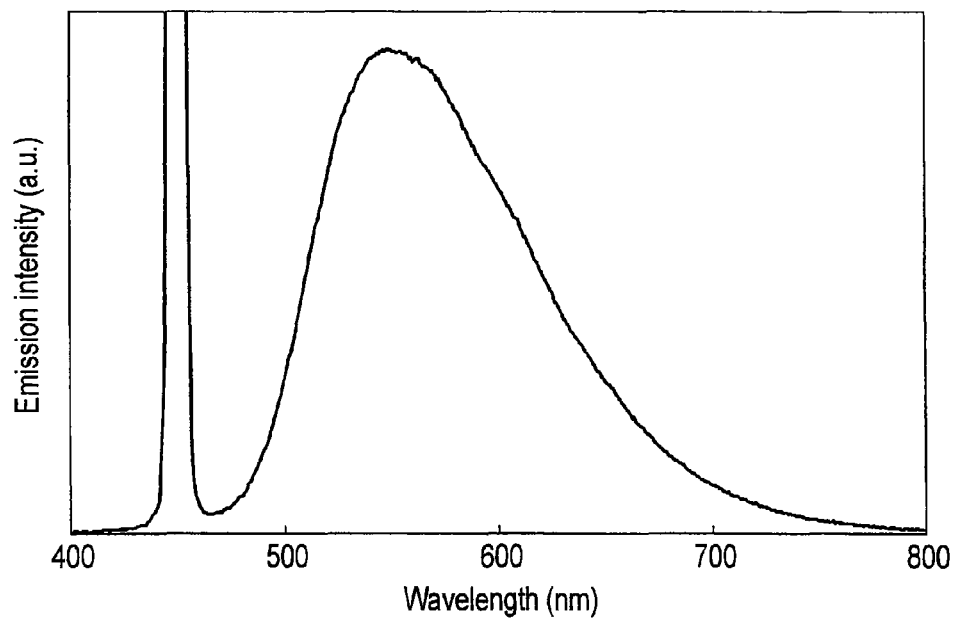
F I G. 5

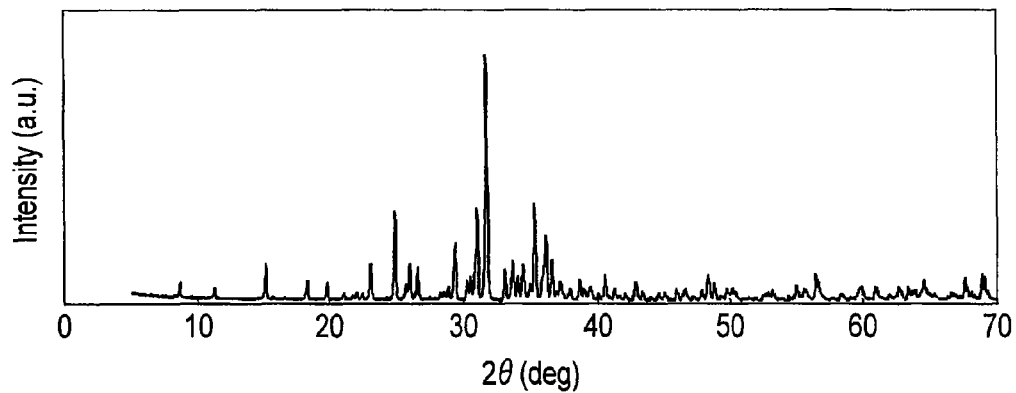
F I G. 10
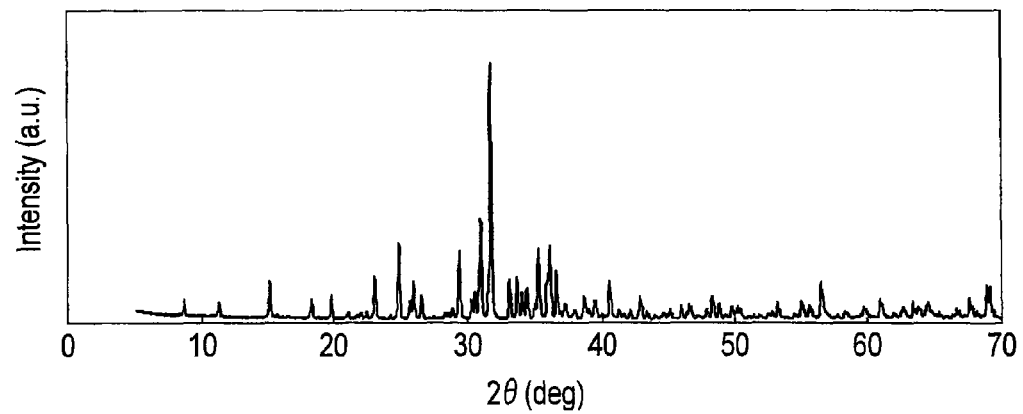
F I G. 11

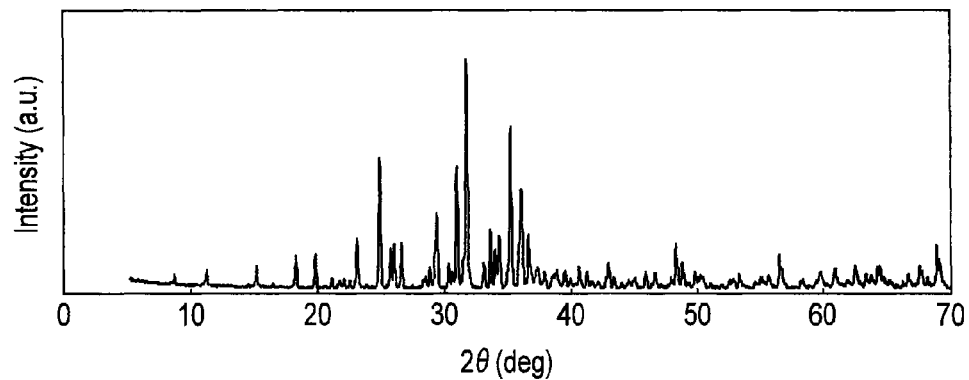
F I G. 12
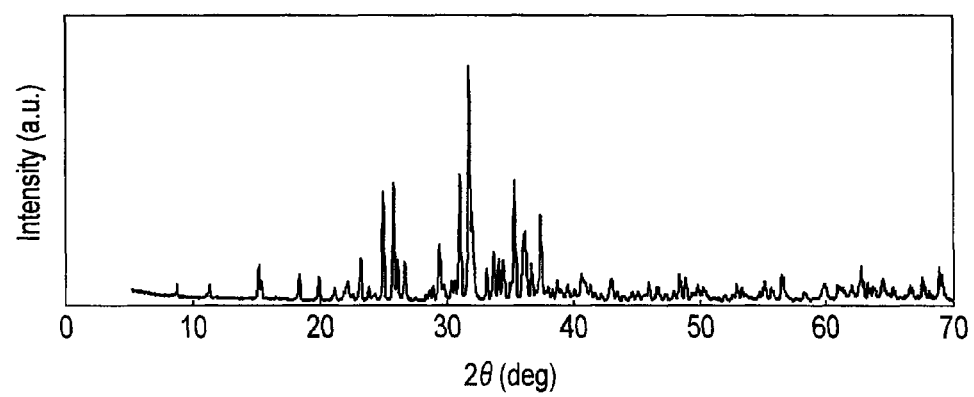
F I G. 13

PHOSPHOR

CROSS-REFERENCE TO RELATED APPLICATIONS

This application is based upon and claims the benefit of priority from Japanese Patent Application No. 2013-103400 filed May 15, 2013; the entire contents of which are incorporated herein by reference.

FIELD

Embodiments described herein generally relate to a phosphor, a light-emitting device, and a method for manufacturing the phosphor.

BACKGROUND

A white light-emitting device is configured, for example, by combining a phosphor which emits red light by excitation with blue light, a phosphor which emits green light by excitation with blue light, and a blue LED. When a phosphor which emits yellow light by excitation with blue light is used, a white light-emitting device can be configured by using fewer kinds of phosphors. As such a yellow-emitting phosphor, for example, an Eu-activated orthosilicate phosphor is known.

There is an increasing need for the yellow-emitting phosphor to improve temperature property, quantum efficiency, and luminescence emission spectrum half width.

BRIEF DESCRIPTION OF THE DRAWINGS

FIG. 4 is an XRD pattern of the phosphor of Example 1;

FIG. 5 is a view showing luminescence emission spectrum of the phosphor of Example 1;

FIG. 10 is an XRD pattern of a phosphor of Example 5;

FIG. 11 is an XRD pattern of a phosphor of Example 6;

FIG. 12 is an XRD pattern of a phosphor of Example 7; and

FIG. 13 is an XRD pattern of a phosphor of Example 8.

DETAILED DESCRIPTION

Figure 1A:
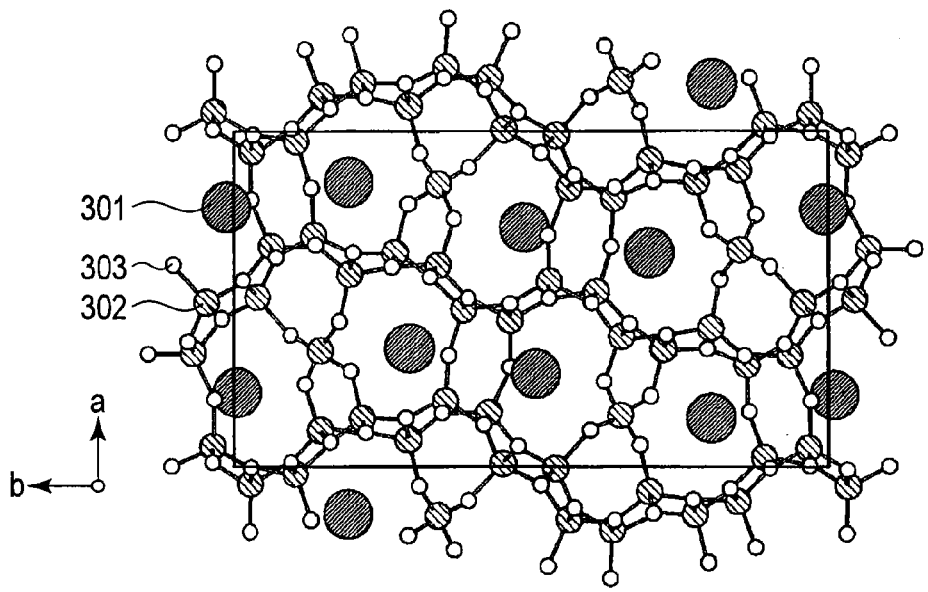
FIGS. 1A, 1B and 1C are views showing crystal structures of $Sr_2Al_3Si_7ON_{13}$.

According to one embodiment, the phosphor exhibits a luminescence peak within a wavelength range of 500 to 600 nm when excited with light having an emission peak within a wavelength range of 250 to 500 nm. Such a phosphor has a composition represented by the following Formula 1, and has a crystalline aspect ratio of 1.5 to 10.

$$(M_{1-x}Ce_x)_{2y}Al_zSi_{10-z}O_uN_w \quad \text{Formula 1}$$

(wherein M represents Sr and a part of the Sr may be substituted by at least one selected from Ba, Ca and Mg; and x, y, z, u and w satisfy the following conditions:
 $0 < x \le 1$, $0.8 \le y \le 1.1$, $2 \le z \le 3.5$, $0 < u \le 1$ $1.8 \le z-u$, and $13 \le u+w \le 15$)

Embodiments are specifically explained below.

A phosphor according to one embodiment exhibits a luminescence peak within a wavelength range of 500 to 600 nm when it is excited with light having an emission peak within a wavelength range of 250 to 500 nm, and thus it is a phosphor capable of emitting light having a color range of yellowish-green to orange. As the material mainly emits yellow light, the phosphor of the present embodiment is hereinafter referred to as a "yellow-emitting phosphor." Such a phosphor includes a matrix having a crystal structure which is substantially the same as that of $Sr_2Si_7Al_3ON_{13}$, and this matrix can be activated with Ce. The yellow-emitting phosphor according to the present embodiment has a composition represented by the following Formula 1, and the phosphor has a crystalline aspect ratio of 1.5 to 10.

$$(M_{1-x}Ce_x)_{2y}Al_zSi_{10-z}O_uN_w \quad \text{Formula 1}$$

wherein M represents Sr and a part of the Sr may be substituted by at least one selected from Ba, Ca and Mg; and x, y, z, u and w satisfy the following conditions:
 $0 < x \le 1$, $0.8 \le y \le 1.1$, $2 \le z \le 3.5$ $0 < u \le 1$, $1.8 \le z-u$, and $13 \le u+w \le 15$.

As shown in Formula 1, a part of M is substituted by the luminous center element Ce. M is Sr, and a part of Sr may be substituted by at least one selected from Ba, Ca and Mg. Generation of a heterophase is not promoted even if at least one selected from Ba, Ca and Mg is included so long as the content thereof is 15 at. % or less of the total amount of M, more preferably 10 at. % or less.

When at least 0.1% by mole of M is substituted by Ce, a sufficient luminous efficiency can be obtained. The total amount of M may be substituted by Ce (x=1), but when x is less than 0.5, reduction of external quantum efficiency (concentration quenching) can be inhibited to the utmost. The number x is, accordingly, preferably 0.001 to 0.5. As the luminous center element Ce is included, the phosphor of the present embodiment emits light having a color range of yellowish-green to orange, that is, emits light having a peak within the wavelength range of 500 to 600 nm, when it is excited with light having an emission peak within a wavelength range of 250 to 500 nm. Even if other elements, such as impurities, are unavoidably included, the desired properties are not impaired, so long as the content thereof is 15 at. % or less of the number of Ce, more desirably 10 at. % or less. Such other elements may include, for example, Tb, Eu, Mn, and the like.

When y is less than 0.8, crystal defects are increased, which leads to reduction in efficiency. On the other hand, when y exceeds 1.1, an excessive amount of alkaline earth metal is precipitated as a heterophase, which leads to reduction in luminescent property. y is preferably from 0.85 to 1.06.

When z is less than 2, an excessive amount of Si is precipitated as a heterophase, which leads to reduction in luminescent property. On the other hand, when z exceeds 3.5, an excessive amount of Al is precipitated as a heterophase, which leads to reduction in luminescent property. z is preferably from 2.5 to 3.3.

When u exceeds 1, the efficiency is reduced by an increase in crystal defects. u is preferably from 0.001 to 0.8.

When (z−u) is less than 1.8, it becomes impossible to maintain the crystal structure of this embodiment. In some cases, a heterophase is produced and thus an effect of this embodiment is not exerted. When (u+w) is less than 13 or exceeds 15, it becomes similarly impossible to maintain the crystal structure of this embodiment. In some cases, a heterophase is produced and thus an effect of this embodiment is not exerted. (z−u) is preferably 2 or more and (u+w) is preferably from 13.2 to 14.2.

In addition, the phosphor according to the present embodiment has an aspect ratio within a range of 1.5 to 10. The aspect ratio of the phosphor is defined as a ratio of the maximum diameter of the phosphor particles to the minimum diameter in a direction vertical to the maximum diameter (the maximum diameter/the minimum diameter). The aspect ratio can be obtained by the following method: a method in which the maximum diameter and the minimum diameter of a particle are measured from an SEM observation image of a phosphor particle.

The aspect ratio of the phosphor can be controlled by changing a bulk density of a raw material powder when it is heated.

It has been found by the present inventors that when the aspect ratio of the phosphor is too small, the quantum efficiency is reduced; whereas, when the aspect ratio of the phosphor is too large, the reduction of the quantum efficiency as well as the dispersion faulty in a resin occur, thus resulting in occurrence of defective coating. In the present embodiment, the aspect ratio of the phosphor is set at a range of 1.5 to 10, and thus the disadvantages described above can be avoided.

Since the phosphor according to this embodiment has all the conditions, it can emit yellow light with a wide luminescence emission spectrum half width with high efficiency when excited with light having an emission peak in a wavelength ranging from 250 to 500 nm. Thus, white light excellent in color rendering properties is obtained. Additionally, the yellow-emitting phosphor according to this embodiment has good temperature property.

It can be also said that the yellow-emitting phosphor of the present embodiment is a material based on the $Sr_2Al_3Si_7ON_{13}$ group crystals, in which Sr, Si, Al, O or N, which are elements constituting the crystals, is substituted by another element, or another metal element such as Ce is dissolved. Although the crystal structure is slightly changed by such a substitution, a large change of the positions of the atoms, such as breakage of a chemical bond between backbone atoms, rarely occurs. The position of the atom is provided by the crystal structure, the site accounting for the atom and the coordinates thereof.

The effect of this embodiment can be exerted within a range in which the basic crystal structure of the yellow-emitting phosphor of this embodiment does not change. The lattice constant and the length of the chemical bond of M-N and M-O (near neighbor interatomic distance) of the phosphor according to this embodiment may be different from those of $Sr_2Al_3Si_7ON_{13}$. If the variation is less than ±15% of the lattice constant of $Sr_2Al_3Si_7ON_{13}$ and the length of the chemical bond in $Sr_2Al_3Si_7ON_{13}$ (Sr—N and Sr—O), the case is defined as an unchanged crystal structure. The lattice constant can be determined by X-ray diffraction or neutron diffraction, while the length of the chemical bond of M-N and M-O (proximity atomic distance) can be calculated from atomic coordinates.

The crystal of $Sr_2Al_3Si_7ON_{13}$ has a orthorhombic system and have a lattice constant of a=11.8 Å, b=21.6 Å, and c=5.01 Å. The crystals belong to a space group Pna 21 (the 33rd in a space group shown in a literature (International Tables for Crystallography, Volume A: Space-group symmetry, edited by T. Hahn, published by Springer (Netherlands) (publication date: 1983, the first edition))). The atomic coordinate of $Sr_2Al_3Si_7ON_{13}$, obtained by analysis according to a single crystal XRD is shown in Table 1. The lengths of the chemical bonds in $Sr_2Al_3Si_7ON_{13}$ (Sr—N and Sr—O) can be calculated from the atomic coordinates shown in Table 1 using the Pythagorean theorem.

TABLE 1

| Site | Occupancy ratio | x | y | z |
|---|---|---|---|---|
| Sr1 | 4a | 1 | 0.2786 | 0.49060 (11) | 0.5284 (14) |
| Sr2 | 4a | 1 | 0.3552 (3) | 0.69839 (12) | 0.048 (2) |
| Si/Al1 | 4a | 1 | 0.3582 (9) | 0.2769 (3) | 0.070 (3) |
| Si/Al2 | 4a | 1 | 0.5782 (9) | 0.7996 (4) | 0.047 (5) |
| Si/Al3 | 4a | 1 | 0.5563 (8) | 0.4672 (3) | 0.543 (5) |
| Si/Al4 | 4a | 1 | 0.4724 (8) | 0.6092 (3) | 0.556 (4) |
| Si/Al5 | 4a | 1 | 0.1910 (7) | 0.6397 (3) | 0.535 (4) |
| Si/Al6 | 4a | 1 | 0.0061 (8) | 0.5438 (3) | 0.546 (4) |
| Si/Al7 | 4a | 1 | 0.1625 (9) | 0.5661 (3) | 0.038 (4) |
| Si/Al8 | 4a | 1 | 0.3937 (8) | 0.3469 (3) | 0.547 (4) |
| Si/Al9 | 4a | 1 | 0.1552 (18) | 0.3483 (8) | 0.318 (3) |
| Si/Al10 | 4a | 1 | 0.1525 (14) | 0.3492 (6) | 0.813 (2) |
| O/N1 | 4a | 1 | 0.436 (2) | 0.8164 (10) | 0.061 (11) |
| O/N2 | 4a | 1 | 0.699 (2) | 0.4692 (10) | 0.513 (10) |
| O/N3 | 4a | 1 | 0.334 (2) | 0.6355 (10) | 0.511 (9) |
| O/N4 | 4a | 1 | 0.213 (2) | 0.2980 (11) | 0.056 (12) |
| O/N5 | 4a | 1 | 0.256 (2) | 0.3750 (10) | 0.563 (9) |
| O/N6 | 4a | 1 | 0.894 (2) | 0.6002 (12) | 0.549 (14) |
| O/N7 | 4a | 1 | 0.358 (3) | 0.2062 (12) | 0.893 (6) |
| O/N8 | 4a | 1 | 0.508 (2) | 0.4677 (12) | 0.885 (6) |
| O/N9 | 4a | 1 | 0.398 (2) | 0.2727 (12) | 0.392 (6) |
| O/N10 | 4a | 1 | 0.430 (3) | 0.3336 (15) | 0.896 (7) |
| O/N11 | 4a | 1 | 0.942 (3) | 0.4814 (15) | 0.371 (8) |
| O/N12 | 4a | 1 | 0.662 (2) | 0.8571 (12) | 0.893 (6) |
| O/N13 | 4a | 1 | 0.128 (3) | 0.5743 (15) | 0.381 (7) |
| O/N14 | 4a | 1 | 0.495 (3) | 0.3982 (13) | 0.383 (6) |

It is essential for the yellow-emitting phosphor of this embodiment to have such a crystal structure. When the length of the chemical bond changes beyond the range, the chemical bond is cleaved and converted to a different crystal. It is impossible to obtain an effect by the present embodiment.

The yellow-emitting phosphor of this embodiment includes an inorganic compound having a crystal structure substantially the same as $Sr_2Al_3Si_7ON_{13}$ as a base material and a part of the constituent element M is substituted by the luminous center ion Ce. The composition of each element is specified within a predetermined range. In this case, the phosphor exhibits preferable properties such as high efficiency, wide luminescence emission spectrum half width, and temperature property.

Figure 1B:
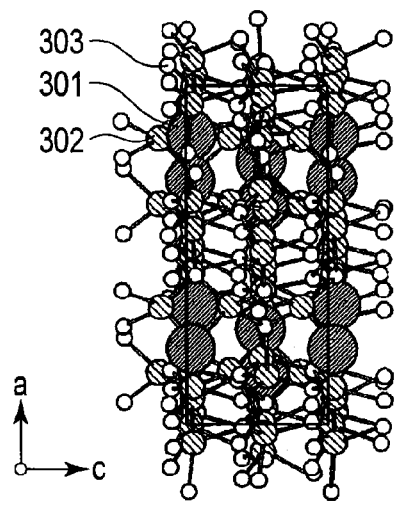
Figure 1C:
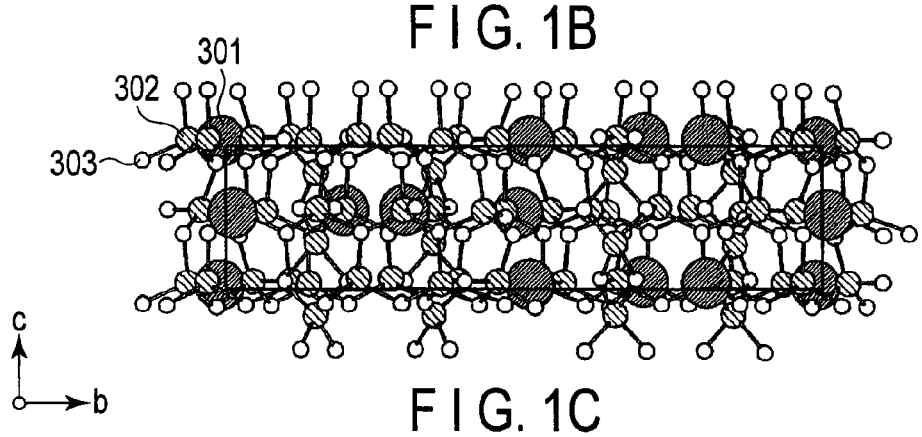

Based on the atomic coordinates shown in Table 1, the crystal structure of $Sr_2Al_3Si_7ON_{13}$ is as shown in FIGS. 1A, 1B and 1C. FIG. 1A is a projection view in an axial direction c, FIG. 1B is a projection view in an axial direction b, and FIG. 1C is a projection view in an axial direction a. In the drawings, 301 represents an Sr atom and its circumference is surrounded by an Si atom or an Al atom 302 and an O atom or an N atom 303. The crystal of $Sr_2Al_3Si_7ON_{13}$ can be identified by XRD and neutron diffraction.

The phosphor of this embodiment has the composition represented by Formula 1 above. The phosphor has a peak at a specific diffraction angle (2θ) in X-ray diffraction pattern by the Bragg-Brendano method using Cu—Kα line. That is, it has at least ten peaks at diffraction angles (2θ) of 15.05-15.15, 23.03-23.13, 24.87-24.97, 25.7-25.8, 25.97-26.07, 29.33-29.43, 30.92-31.02, 31.65-31.75, 31.88-31.98, 33.02-33.12, 33.59-33.69, 34.35-34.45, 35.2-35.3, 36.02-36.12, 36.55-36.65, 37.3-37.4 and 56.5-56.6.

The yellow-emitting phosphor according to this embodiment can be produced by mixing raw material powder containing each element and heating it.

An M raw material can be selected from nitrides and carbides of M. An Al raw material can be selected from nitrides, oxides, and carbides of Al, and an Si raw material can be selected from nitrides, oxides, and carbides of Si. A raw material of the luminous center element Ce can be selected from oxides, nitrides, and carbonates of Ce.

In this regard, nitrogen can be obtained by the nitride raw material or heating in an atmosphere containing nitrogen, while oxygen can be obtained from the oxide raw material and the surface-oxidized film of nitride raw materials. For example, an intended starting composition of $Sr_3N_2$, AlN, $Si_3N_4$, $Al_2O_3$, AlN, and $CeO_2$ is mixed. $Sr_2N$, SrN or mixtures thereof may be used in place of $Sr_3N_2$. In order to obtain a uniform mixed powder, each raw material powder is desirably dry-mixed in order of increasing mass.

The raw material can be mixed using a mortar, for example, in a glove box. The mixed powder is put in a crucible and heated under a predetermined condition to obtain the phosphor according to this embodiment. The material of the crucible is not particularly limited and the material can be selected from boron nitride, silicon nitride, silicon carbide, carbon, aluminium nitride, sialon, aluminium oxide, molybdenum, tungsten, and the like.

It is desirable that the mixed powder is heated under pressure more than atmospheric pressure. The heating under pressure more than atmospheric pressure is advantageous in terms of the fact that silicon nitride is hardly decomposed. In order to suppress the decomposition of silicon nitride at high temperatures, the pressure is preferably 5 atmospheres or more and the heating temperature is preferably from 1500 to 2000° C. When the heating is performed under such conditions, a target heated body is obtained without causing any trouble such as sublimation of materials or products. The heating temperature is preferably from 1800 to 2000° C.

In order to avoid oxidation of AlN, the heating is desirably performed in a nitrogen atmosphere. The amount of hydrogen in the atmosphere may be up to about 90 atm. %.

It is preferable that the mixed powder is heated at the above temperature for 0.5 to 4 hours, the heated material is taken out from the crucible, and cracked and heated under the same conditions again. When a series of processes of taking out, cracking, and heating the powder is repeated about 10 times at most, an advantage such that powder with little fusion between crystal particles and a uniform composition and crystal structure is easily produced.

After heating, post-treatment such as a washing process is performed, if necessary to obtain a phosphor according to one embodiment. As the washing process, for example, washing with pure water, washing with acid or the like can be employed. Usable examples of acid include inorganic acids such as sulfuric acid, nitric acid, hydrochloric acid, and hydrofluoric acid; organic acids such as formic acid, acetic acid, and oxalic acid; and mixed acids thereof.

After the washing with acid, post-annealing treatment may be performed, if necessary. The post-annealing treatment can be performed, for example, in a reducing atmosphere containing nitrogen and hydrogen. The crystallinity and the luminous efficiency are improved by performing the post-annealing treatment.

Figure 2:
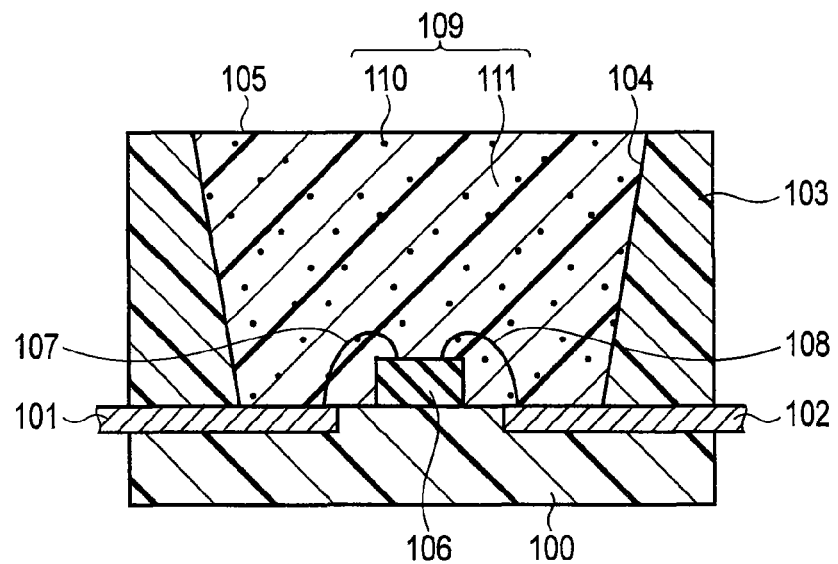
FIG. 2 is a schematic view showing the structure of a light-emitting device according to one embodiment.

A light-emitting device according to one embodiment includes a luminous layer including the phosphor described above, and a light-emitting element exciting the phosphor described above. FIG. 2 is a schematic view showing a structure of a light-emitting device according to one embodiment.

In the light-emitting device shown in FIG. 2, leads 101 and 102 and a package cup 103 are arranged on a substrate 100. The substrate 100 and the package cup 103 are formed from resin. The package cup 103 has a recess 105 having an upper portion wider than the bottom thereof. The sidewall of the recess serves as a reflective surface 104.

A light-emitting element 106 is mounted on a central portion of the approximately circular bottom of the recess 105 by an Ag paste. The light-emitting element 106 to be used emits light having an emission peak in a wavelength ranging from 250 to 500 nm. Examples thereof include light emitting diodes and laser diodes. Specifically, a semiconductor light emitting element such as a GaN-based LED is used, however, is not particularly limited thereto.

A positive electrode (p electrode) and a negative electrode (n electrode) (not shown) of the light-emitting element 106 are connected, through bonding wires 107 and 108 formed of Au and the like, with the lead 101 and the lead 102, respectively. The arrangement of these leads 101 and 102 may be optionally modified.

As the light-emitting element 106, it is also possible to employ a flip-chip structure in which the n electrode and the p electrode are disposed on the same surface thereof. In this case, it is possible to overcome the problems associated with wiring, such as the cut-off or peeling of wire and the absorption of light by the wire, thereby allowing for the production of a semiconductor light-emitting device which is excellent in reliability and luminance. The following structure can be formed using the light-emitting element having an n-type substrate. An n electrode is formed on the rear surface of the n-type substrate of the light-emitting element and a p electrode is formed on the top surface of a p-type semiconductor layer laminated on the substrate. The n electrode is mounted on the lead and the p electrode is connected with the other lead by wire.

A luminous layer 109 containing a phosphor 110 according to one embodiment is disposed in the recess 105 of the package cup 103. In the luminous layer 109, for example, 5 to 60% by mass of the phosphor 110 is contained in a resin layer 111 formed of silicone resin. As described above, the phosphor according to this embodiment contains $Sr_2Al_3Si_7ON_{13}$ as a parent material. Such oxynitrides have high covalent bonding properties. Thus, the phosphor according to this embodiment is hydrophobic and has good compatibility with resin. Therefore, scattering at an interface between the resin layer and the phosphor is significantly suppressed and a light extracting efficiency is improved.

The yellow-emitting phosphor according to this embodiment has good temperature property and can emit yellow light with a wide luminescence emission spectrum half width with high efficiency. A white light-emitting device excellent in emission property is obtained by combining with the light-emitting element which emits light having an emission peak in a wavelength ranging from 250 to 500 nm.

The size and kind of the light-emitting element 106 as well as the size and shape of the recess 105 may be optionally modified.

The light-emitting device according to one embodiment is not limited to the package cup type shown in FIG. 2 and it may be optionally modified. Specifically, in the case of a bullet-shaped LED or a surface-mounted LED, the phosphor of the embodiment can be used to obtain the same effect.

Figure 3:
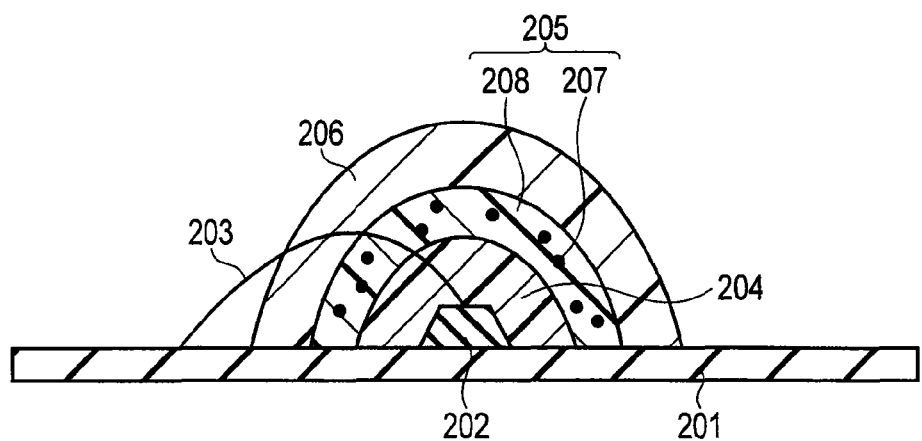
FIG. 3 is a schematic view showing the structure of a light-emitting device according to another embodiment.

FIG. 3 is a schematic view showing the structure of a light-emitting device according to anther embodiment. In the shown light-emitting device, p and n electrodes (not shown) are formed in a predetermined region of a heat-dissipative insulation substrate 201, and a light-emitting element 202 is arranged thereon. The material of the heat-dissipative insulation substrate may be, for example, AlN.

One of the electrodes in the light-emitting element 202 is formed on the bottom surface and is electrically connected with the n electrode of the heat-dissipative insulation substrate 201. The other electrode in the light-emitting element 202 is connected, through a gold wire 203, with the p electrode (not shown) on the heat-dissipative insulation substrate 201. As the light-emitting element 202, a light emitting diode which emits light having an emission peak in a wavelength ranging from 250 to 500 nm is used.

A dome-shaped inside transparent resin layer 204, a luminous layer 205, and an outside transparent resin layer 206 are sequentially formed on the light-emitting element 202. The inside transparent resin layer 204 and the outside transparent resin layer 206 can be formed, for example, using silicone. In the luminous layer 205, a yellow-emitting phosphor 207 of this embodiment is contained in, for example, a resin layer 208 formed of silicone resin.

In the light-emitting device shown in FIG. 3, the luminous layer 205 containing the yellow-emitting phosphor according to this embodiment can be simply produced by employing procedures such as vacuum printing or drop-coating with a dispenser. Additionally, the luminous layer 205 is sandwiched between the inside transparent resin layer 204 and the outside transparent resin layer 206 and thus an effect of improving extracting efficiency is obtained.

The luminous layer in the light-emitting device according to the present embodiment may include a phosphor capable of emitting green light by excitation with blue light and a phosphor capable of emitting red light by excitation with blue light, together with the yellow-emitting phosphor of the present embodiment. In this case, a white light-emitting device having a more excellent color rendering property can be obtained.

Yellow emission can also be obtained when the yellow-emitting phosphor according to the present embodiment is excited with light in the ultraviolet region having a peak within a wavelength range of 250 to 400 nm. A white light-emitting device, therefore, can also be formed by combining the phosphor according to the present embodiment with, for example, a phosphor capable of emitting blue light by excitation with ultraviolet light and a light-emitting element such as an ultraviolet light-emitting diode. The luminous layer in the white light-emitting device may include a phosphor capable of emitting light having a peak within another wavelength range by excitation with ultraviolet light together with the yellow-emitting phosphor of the present embodiment. Such a phosphor may include, for example, a phosphor capable of emitting red light by excitation with ultraviolet light, a phosphor capable of emitting green light by excitation with ultraviolet light, and the like.

As described above, the phosphor of this embodiment has good temperature property and can emit yellow light with a wide luminescence emission spectrum half width with high efficiency. When combining the yellow-emitting phosphor of this embodiment and a light-emitting element which emits light having an emission peak in a wavelength ranging from 250 to 500 nm, a white light-emitting device excellent in emission property can be obtained using a few kinds of phosphors.

Specific examples of the phosphor and the light-emitting device are shown below.

First, $Sr_3N_2$, $CeO_2$, $Si_3N_4$, and AlN were prepared as a raw material for Sr, a raw material for Ce, a raw material for Si, and a raw material for Al, and each material was weighed in a vacuum glove box. Blending masses of $Sr_3N_2$, $CeO_2$, $Si_3N_4$ and AlN were 2.680 g, 0.147 g, 5.086 g, and 1.691 g, respectively. The blended starting material powders were dry-mixed in an agate mortar.

The obtained mixture was sieved into a boron nitride (BN) crucible through a sieve having an aperture of 500 μm, and the mixture was heated at 1800° C. for one hour in a nitrogen atmosphere at a pressure of 7.5 atmospheres. A bulk density of the starting material powder was 0.48 g/cc when it was filled in the crucible. The heated product was taken out from the crucible, and it was cracked in an agate mortar. The heated product cracked was put in the crucible again, and it was heated at 1800° C. for 2 hours. A series of steps of taking out, cracking and heating were repeated a further two times, thereby obtaining a phosphor of Example 1.

The aspect ratio of this phosphor was measured as follows. First, SEM observation images of phosphor particles were obtained, and the maximum diameter and the minimum diameter, which is in a direction vertical to the maximum diameter, of multiple particles (10 to 1000 particles) in a 1 mm square visual field were measured. The aspect ratio of the phosphor of Example 1 was obtained by dividing the maximum diameter by the minimum diameter and calculating an average value thereof. The phosphor of Example 1 had an aspect ratio of 3.

The obtained phosphor was powder with yellow body color. When it was excited with black light, yellow emission was confirmed.

The XRD pattern of the phosphor is shown in FIG. 4. The XRD pattern herein is determined based on X-ray diffraction by the Bragg-Brendano method using Cu—Kα line. As shown in FIG. 4, peaks appear at diffraction angles (2θ) of 15.05-15.15, 23.03-23.13, +24.87-24.97, 25.7-25.8, 25.97-26.07, 29.33-29.43, 30.92-31.02, 31.65-31.75, 31.88-31.98, 33.02-33.12, 33.59-33.69, 34.35-34.45, 35.2-35.3, 36.02-36.12, 36.55-36.65, 37.3-37.4, and 56.5-56.6.

Relative intensities of the peaks shown in FIG. 4 are summarized in Table 2.

TABLE 2

| 2θ (deg) | Example 1 |
|---|---|
| 15.05-15.15 | 13 |
| 23.03-23.13 | 12 |
| 24.87-24.97 | 30 |
| 25.7-25.8 | 16 |
| 25.97-26.07 | 13 |
| 29.33-29.43 | 18 |
| 30.92-31.02 | 39 |
| 31.65-31.75 | 100 |
| 31.88-31.98 | 14 |
| 33.02-33.12 | 13 |
| 33.59-33.69 | 12 |
| 34.35-34.45 | 9 |
| 35.2-35.3 | 26 |
| 36.02-36.12 | 18 |
| 36.55-36.65 | 15 |
| 37.3-37.4 | 12 |
| 56.5-56.6 | 12 |

Luminescent emission spectra when the phosphor was excited with light dispersed at an emission wavelength of 450 nm from a xenon lamp are shown in FIG. 5. In FIG. 5, an emission with a narrow half width near 450 nm is reflection of excitation light and is not luminescence of the phosphor. A high luminescence intensity having a peak wavelength of 551 nm was confirmed. The half width calculated with an instant multichannel spectrometer was 117 nm. The half width is one of the indicators for color rendering properties of white light generated from the light-emitting device. Generally, as the half width is wider, white light excellent in color rendering properties is easily obtained. Since the half width is 117 nm, it is suggested that white light excellent in color rendering properties is easily obtained by using the phosphor of Example 1.

Figure 6:
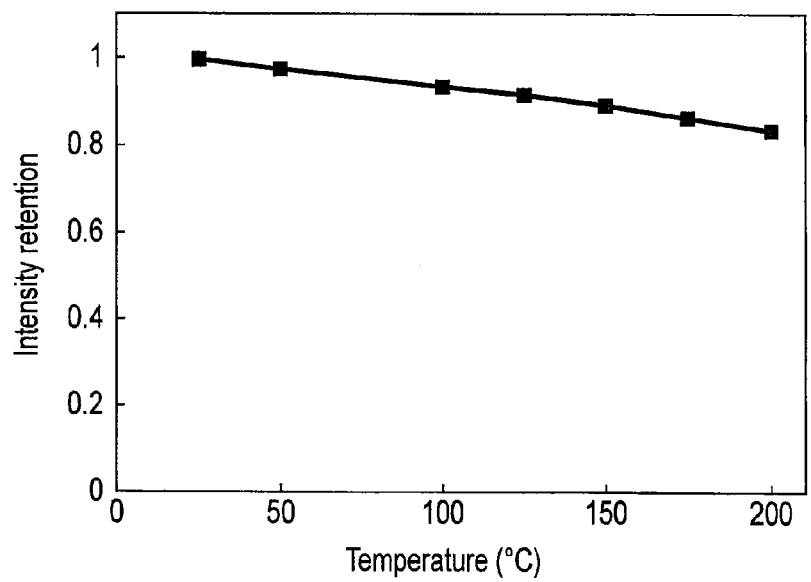
FIG. 6 is a view showing a temperature property of the phosphor of Example 1.
Figure 7:
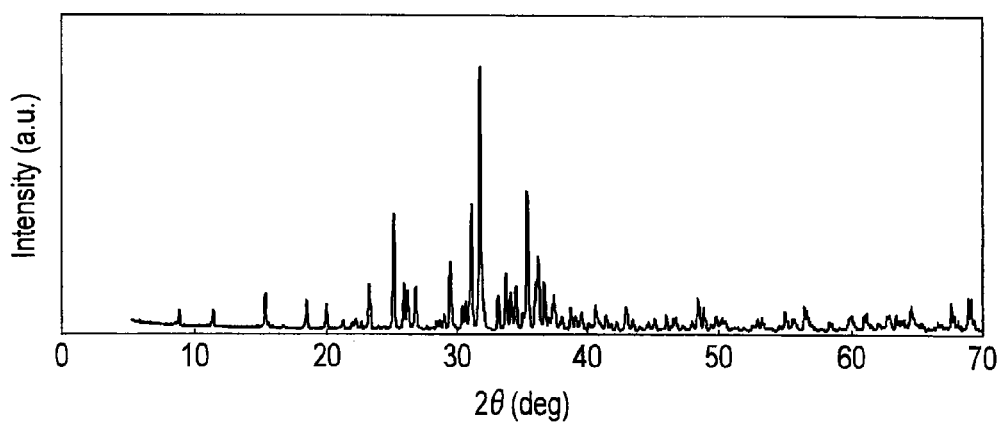
FIG. 7 is an XRD pattern of a phosphor of Example 2.
Figure 8:
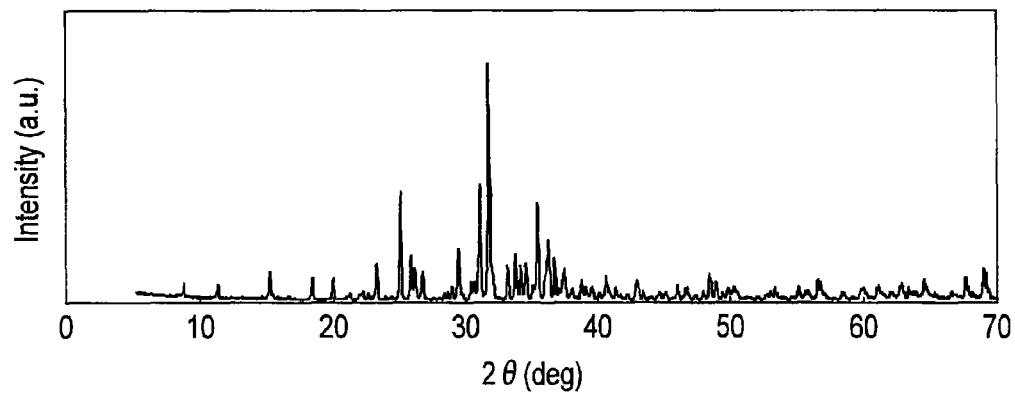
FIG. 8 is an XRD pattern of a phosphor of Example 3.
Figure 9:
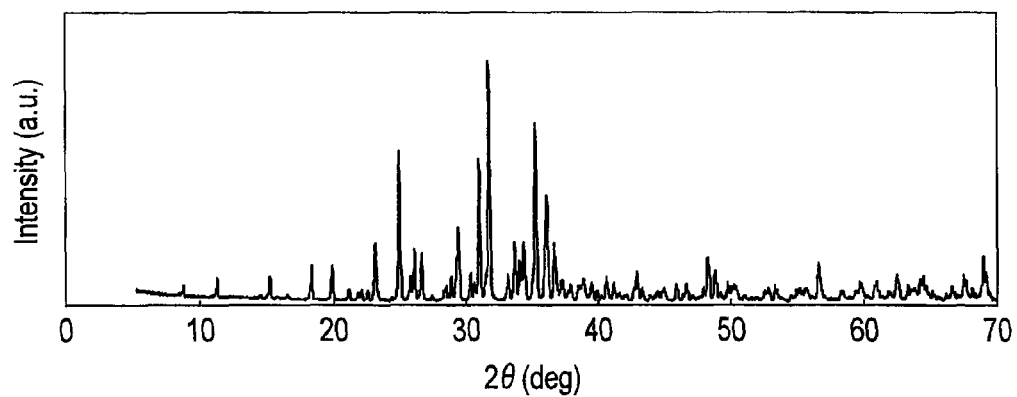
FIG. 9 is an XRD pattern of a phosphor of Example 4.

FIG. 6 shows temperature property of the phosphor. The temperature property was determined as follows. The phosphor is heated by a heater and the luminescence intensity ($I_T$) at a predetermined temperature of T° C. was obtained. The instant multichannel spectrometer was used to measure the luminescence intensity. The luminescence intensity ($I_{25}$) at 25° C. was used and calculated from the formula of ($I_T/I_{25}$)×100. As shown in FIG. 6, it is found that intensity retention of 0.88 or more is obtained at 150° C. and a decrease in the luminescence intensity is low even if the temperature is increased.

The light-emitting device with the structure shown in FIG. 3 was produced using the phosphor of this example.

As the heat-dissipative insulation substrate 201, an AlN substrate having a square of 8 mm in which p and n electrodes (not shown) were formed in a predetermined region was prepared. As the light-emitting element 202, a light emitting diode having an emission peak in a wavelength of 460 nm was bonded to the substrate with solder. One of the electrodes in the light-emitting element 202 was formed on the bottom surface and was electrically connected with the n electrode of the AlN substrate 201. The other electrode in the light-emitting element 202 was connected, through a gold wire 203, with the p electrode (not shown) on an AlN substrate 201.

The inside transparent resin layer 204, the luminous layer 205, and the outside transparent resin layer 206 were sequentially formed into a dome shape on the light-emitting element 202 and a light-emitting device of this example was produced. Silicone resin was used as the material of the inside transparent resin layer 204 and the layer was formed with a dispenser. Transparent resin containing 50% by mass of the phosphor of this example was used to form the luminous layer 205. The used transparent resin is silicone resin. Further, the same silicone resin as the case of the inside transparent resin layer 204 was used to form the outside transparent resin layer 206 on the luminous layer 205.

When the light-emitting device was placed in an integrating sphere and driven at 20 mA and 3.3 V, the color temperature was 6300K, the luminous efficiency was 180 lm/W, and Ra was equal to 76. The color temperature, luminous efficiency, and Ra were obtained from the instant multichannel spectrometer.

A white light-emitting device of this example was obtained by combining the phosphor of this example with a blue LED having an emission peak in a wavelength of 460 nm. The use of the white light-emitting device allows for the formation of a white LED for high power application having a high luminescent efficiency and high color rendering properties.

Further, as shown in Table 3, phosphors of Examples 2 to 8 were obtained in the same manner as in Example 1 except that the raw material and the blending mass thereof were changed. In addition, the phosphor of Example 1 was subjected to tapping 100 times when it was filled in a crucible in the first heating, thereby producing a phosphor of Comparative Example 1. The raw material powder had a bulk density of 0.98 g/cc when it was filled in the crucible. The obtained phosphor had an aspect ratio of 1.1.

Furthermore, the phosphor of Example 1 was sieved with a sieve having an aperture of 300 μm into a crucible when it was filled in the crucible in all heating, thereby producing a phosphor of Comparative Example 2. The obtained phosphor had an aspect ratio of 12.

TABLE 3

| | Mass (g) | | | | | |
|---|---|---|---|---|---|---|
| | $Sr_3N_2$ | $CeO_2$ | $CeCl_3$ | $Si_3N_4$ | $Al_2O_3$ | AlN |
| Example 1 | 2.993 | — | 0.155 | 5.262 | 0.000 | 1.537 |
| Example 4 | 2.708 | 0.098 | — | 5.086 | 0.000 | 1.691 |
| Example 5 | 2.680 | 0.147 | — | 5.086 | 0.000 | 1.691 |
| Example 7 | 2.821 | 0.155 | — | 4.911 | 0.000 | 1.484 |
| Example 9 | 2.708 | 0.098 | — | 4.911 | 0.000 | 1.844 |
| Example 11 | 2.851 | 0.103 | — | 5.086 | 0.000 | 1.691 |
| Example 13 | 2.708 | 0.098 | — | 4.911 | 0.255 | 1.640 |
| Example 17 | 2.653 | 0.098 | — | 5.086 | 0.000 | 1.691 |
| Comparative Example 1 | 2.993 | — | 0.155 | 5.262 | 0.000 | 1.537 |
| Comparative Example 2 | 2.993 | — | 0.155 | 5.262 | 0.000 | 1.537 |

The phosphors in Examples 2 to 8 were powder with yellow body color. When they were excited with black light, yellow luminescence was confirmed. The XRD patterns of these phosphors are sequentially shown in FIGS. 7 to 13. Ten peaks selected from the XRD patterns in descending order of intensity were identified as the strongest peak. The diffraction angles (2θ) were indicated by "◯" in Table 4.

TABLE 4

| | Example number | | | | | | | |
|---|---|---|---|---|---|---|---|---|
| 2θ (deg) | 1 | 2 | 3 | 4 | 5 | 6 | 7 | 8 |
| 15.05-15.15 | — | — | — | — | — | — | — | — |
| 23.03-23.13 | — | ◯ | — | ◯ | ◯ | ◯ | ◯ | — |
| 24.87-24.97 | ◯ | ◯ | ◯ | ◯ | ◯ | ◯ | ◯ | ◯ |
| 25.7-25.8 | ◯ | ◯ | ◯ | — | — | — | — | ◯ |
| 25.97-26.07 | — | — | — | — | ◯ | — | — | — |
| 29.33-29.43 | ◯ | ◯ | ◯ | ◯ | ◯ | ◯ | ◯ | ◯ |
| 30.92-31.02 | ◯ | ◯ | ◯ | ◯ | ◯ | ◯ | ◯ | ◯ |
| 31.65-31.75 | ◯ | ◯ | ◯ | ◯ | ◯ | ◯ | ◯ | ◯ |
| 31.88-31.98 | ◯ | — | — | — | — | — | — | ◯ |
| 33.02-33.12 | — | — | — | — | — | ◯ | — | — |
| 33.59-33.69 | ◯ | ◯ | ◯ | ◯ | ◯ | ◯ | ◯ | ◯ |
| 34.35-34.45 | — | — | ◯ | ◯ | — | — | ◯ | — |
| 35.2-35.3 | ◯ | ◯ | ◯ | ◯ | ◯ | ◯ | ◯ | ◯ |
| 36.02-36.12 | ◯ | ◯ | ◯ | ◯ | ◯ | — | ◯ | ◯ |
| 36.55-36.65 | — | ◯ | ◯ | ◯ | ◯ | — | ◯ | — |
| 37.3-37.4 | ◯ | — | — | — | — | — | — | ◯ |
| 56.5-56.6 | — | — | — | — | — | ◯ | — | — |

In any of the phosphors in the examples, it is found that ten strongest peaks belong to any of diffraction angles (2θ) of 15.05-15.15°, 23.03-23.13°, 24.87-24.97°, 25.7-25.8°, 25.97-26.07°, 29.33-29.43°, 30.92-31.02°, 31.65-31.75°, 31.88-31.98°, 33.02-33.12°, 33.59-33.69°, 34.35-34.45°, 35.2-35.3°, 36.02-36.12°, 36.55-36.65°, 37.3-37.4°, and 56.5-56.6°.

The phosphors of Comparative Examples 1 and 2 were powders having a body color of yellow, and it was confirmed that the materials emitted yellow light when they were excited with black light. In the phosphors of these Comparative Examples, the 10 strongest peaks were not necessarily observed at the angles of diffraction (2θ) described above.

The aspect ratio and the luminescence property of the phosphors of Examples 2 to 8 and Comparative Examples 1 and 2 were found as described above. The results thereof were summarized in Table 5, together with the aspect ratio and the luminescence property of the phosphor of Example 1. In Table 5, the relative quantum efficiency is a relative intensity to the quantum efficiency of Example 4, which is 1, and it was obtained using an integrating sphere total luminous flux measuring device.

TABLE 5

| | Aspect ratio | Luminescence peak wavelength (nm) | Relative intensity (a.u.) | Luminescence half width (nm) |
|---|---|---|---|---|
| Example 1 | 3 | 554 | 1.14 | 116 |
| Example 2 | 2 | 553 | 1.03 | 117 |
| Example 3 | 7 | 550 | 0.99 | 119 |
| Example 4 | 1.8 | 554 | 1.00 | 117 |
| Example 5 | 5.6 | 552 | 1.03 | 118 |
| Example 6 | 3.2 | 553 | 1.13 | 116 |
| Example 7 | 9 | 549 | 0.98 | 118 |
| Example 8 | 2.5 | 552 | 1.02 | 117 |
| Comparative Example 1 | 1.1 | 551 | 0.9 | 121 |
| Comparative Example 2 | 12 | 550 | 0.94 | 124 |

As shown in Table 5, all of the phosphors of Examples 1 to 8 had the aspect ratio within a range of 1.5 to 10. Further, all of the phosphors of Examples 1 to 8 have the luminescence peaks in a wavelength of 549 to 554 nm and a high quantum efficiency of 0.98 or more. The obtained luminescence half-width is a broad emission of 116 nm or more.

On the other hand, from the phosphors of Comparative Examples 1 and 2, sufficient brightness cannot be obtained, that is, they had an aspect ratio outside the range of 1.5 to 10, and quantum efficiency of from 0.9 to 0.94.

The results of chemical analyses of the phosphors of Examples 1 to 8 and Comparative Examples 1 and 2 using inductively coupled plasma (ICP) are summarized in Table 6. The numbers shown in Table 6 are molar ratios obtained by normalizing a concentration of each element analyzed, supposing that a total of a concentration of Al and a concentration of Si is 10.

TABLE 6

| Example number | Sr | Ce | x | y | Al (z) | Si (10 − z) | O (u) | N (w) | Al − O (z − u) | O + N (u + w) |
|---|---|---|---|---|---|---|---|---|---|---|
| 1 | 1.93 | 0.042 | 0.021 | 0.99 | 2.50 | 7.50 | 0.39 | 13.85 | 2.11 | 14.24 |
| 2 | 1.83 | 0.038 | 0.02 | 0.93 | 2.83 | 7.17 | 0.51 | 12.88 | 2.32 | 13.38 |
| 3 | 1.80 | 0.059 | 0.032 | 0.93 | 2.81 | 7.19 | 0.56 | 13.01 | 2.24 | 13.57 |
| 4 | 1.83 | 0.061 | 0.032 | 0.95 | 3.23 | 6.77 | 0.97 | 12.47 | 2.26 | 13.44 |
| 5 | 1.81 | 0.038 | 0.021 | 0.92 | 3.08 | 6.92 | 0.51 | 13.33 | 2.56 | 13.85 |
| 6 | 1.92 | 0.042 | 0.021 | 0.98 | 2.81 | 7.19 | 0.65 | 13.28 | 2.16 | 13.93 |
| 7 | 1.84 | 0.036 | 0.019 | 0.94 | 3.04 | 6.96 | 0.95 | 12.89 | 2.09 | 13.84 |
| 8 | 1.77 | 0.038 | 0.021 | 0.90 | 2.78 | 7.22 | 0.58 | 12.91 | 2.20 | 13.49 |
| Comparative Example 1 | 1.87 | 0.043 | 0.021 | 0.97 | 2.56 | 7.44 | 0.33 | 13.3 | 2.23 | 13.63 |
| Comparative Example 2 | 1.90 | 0.041 | 0.021 | 0.97 | 2.58 | 7.42 | 0.36 | 13.4 | 2.22 | 13.76 |

In Table 6, x, y, z, u and w correspond to x, y, z, u and w in the Formula 1 below, respectively.

$$(M_{1-x}Ce_x)_{2y}Al_zSi_{10-z}O_uN_w \qquad \text{Formula 1}$$

As shown in Table 6, x, y, z, u and w of any phosphor of Examples 1 to 8 are within the range described below.

$0 < x \le 1$, $0.8 \le y \le 1.1$, $2 \le z \le 3.5$, $0 < u \le 1$ $1.8 \le z-u$, $13 \le u+w \le 15$

The phosphors of Examples had the predetermined composition and the predetermined aspect ratio, and thus the materials can emit yellow light having a broad luminescence spectral half-width with a high efficiency.

On the other hand, it was confirmed from Tables 5 and 6 that the phosphor (Comparative Example 1) having an aspect ratio of less than 1.5 had a poor quantum efficiency even if the composition thereof met the prescribed conditions. It was also confirmed from Table 5 and 6 that the phosphor (Comparative Example 2) having an aspect ratio of more than 10 had a poor quantum efficiency even if the composition thereof met the prescribed conditions.

Next, a commercially available, Eu-activated orthosilicate phosphor was prepared as a phosphor of Comparative Example 3.

In addition, phosphors of Comparative Examples 4 to 11 were synthesized using the same compositions as used in the preparation of the phosphor of Example 1, except that the composition in the Formula 1 was partly changed to that shown in Table 7.

TABLE 7

| | Changed composition |
|---|---|
| Comparative Example 4 | y < 0.8 |
| Comparative Example 5 | y > 1.1 |
| Comparative Example 6 | z < 2 |
| Comparative Example 7 | z > 3.5 |
| Comparative Example 8 | u > 1 |
| Comparative Example 9 | z − u < 1.8 |
| Comparative Example 10 | u + w < 13 |
| Comparative Example 11 | 15 < u + w |

Aspect ratios of the phosphor of Comparative Examples 3 to 11 were obtained in the same manner as above, and the results thereof are summarized in Table 8.

TABLE 8

| | Aspect ratio |
|---|---|
| Comparative Example 3 | 1.1 |
| Comparative Example 4 | 4.5 |
| Comparative Example 5 | 8 |

TABLE 8-continued

| | Aspect ratio |
|---|---|
| Comparative Example 6 | 3 |
| Comparative Example 7 | 6.8 |
| Comparative Example 8 | 3.8 |
| Comparative Example 9 | 5.7 |
| Comparative Example 10 | 4 |
| Comparative Example 11 | 9 |

XRD patterns of the phosphors of Comparative Examples 3 to 11 were obtained in the same manner as above. As a result, in the phosphors of Comparative Examples, the 10 strongest peaks were not necessarily observed at the angles of diffraction (2θ) of 15.05-15.15, 23.03-23.13, 24.87-24.97, 25.7-25.8, 25.97-26.07, 29.33-29.43, 30.92-31.02, 31.65-

31.75, 31.88-31.98, 33.02-33.12, 33.59-33.69, 34.35-34.45, 35.2-35.3, 36.02-36.12, 36.55-36.65, 37.3-37.4 and 56.5-56.6.

Light having a wavelength of 450 nm was emitted in the same manner as above to excite the phosphors of Comparative Examples 3 to 11, thereby determining the luminescence property, and, at the same time, the temperature property of each phosphor was obtained. It was confirmed that the phosphors of all the Comparative Examples had neither the luminescence property nor the temperature property.

Specifically, the Eu-activated orthosilicate phosphor (Comparative Example 3) had a narrow half-width of about 70 nm, and thus a light-emitting device having a good color rendering property cannot obtained even if it was combined with a blue light-emitting diode. Moreover, the brightness was remarkably reduced at high temperatures, and thus the efficiency is reduced in a high output light-emitting device to which power of about 300 mW or more is input.

When the value of y in the Formula 1 is less than 0.8 (Comparative Example 4), the crystallizability is reduced, thus resulting in the reduced efficiency, because of the too small amount of Sr+Ce. On the other hand, when the value of y is more than 1.1 (Comparative Example 5), the obtained composition includes Sr+Ce in excess, and the Sr+Ce, which are in excess, form a heterophase, thus resulting in the reduced efficiency.

When the value of z in the Formula 1 is less than 2 (Comparative Example 6), the crystal structure cannot be maintained because of the composition having the too small amount of Al and a different crystal structure is formed, thus resulting in the insufficient property. On the other hand, when the value of z is more than 3.5 (Comparative Example 7), the obtained composition includes Al in excess and a different crystal structure including excess Al is formed, thus resulting in the insufficient property.

When the value of u in the Formula 1 is 1 or more (Comparative Example 8), the composition has too many O, and thus the covalency is reduced, which shortens the wavelength and reduces the efficiency, thus resulting in the insufficient temperature property. On the other hand, when the value of z−u is less than 1.8 (Comparative Example 9), the amount of O in the composition becomes excessively more than the amount of Al and the crystal structure cannot be maintained, thus resulting in the formation of a different crystal structure, whereby the desired property cannot be obtained.

When the value of u+w in the Formula 1 is less than 13 (Comparative Example 10), the obtained composition has an insufficient amount of ionic ions, which destroys a charge balance, and thus the crystal structure cannot be maintained to form a different crystal structure, thus resulting in the insufficient property. On the other hand, when the value of u+w is more than 15 (Comparative Example 11), the obtained composition has an excess amount of ionic ions, which destroys the charge balance, and thus the crystal structure cannot be maintained to form a different crystal structure, thus resulting in the insufficient property.

According to the embodiments of the present invention, the phosphor having a good temperature property and capable of emitting yellow light having the broad spectral half-width can be provided with a high efficiency. When the yellow-emitting phosphor of the present embodiment is combined with a blue LED, the white light-emitting device having the excellent color rendering property and the good luminescence property can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A phosphor which exhibits a luminescence peak within a wavelength range of 500 to 600 nm when excited with light having an emission peak within a wavelength range of 250 to 500 nm, comprising a composition represented by Formula 1 below and a crystalline aspect ratio of 1.5 to 10:

$$(M_{1-x}Ce_x)_{2y}Al_zSi_{10-z}O_uN_w \quad \text{Formula 1}$$

wherein M represents Sr and a part of Sr may be substituted by at least one selected from Ba, Ca and Mg; and x, y, z, u and w satisfy the following conditions:
0<x≤1, 0.8≤y≤1.1, 2≤z≤3.5, 0<u≤1 1.8≤z−u, and 13≤u+w≤15.

2. The phosphor according to claim 1, wherein x satisfies 0.001≤x≤0.5.

3. The phosphor according to claim 1, wherein y satisfies 0.85≤y≤1.06.

4. The phosphor according to claim 1, wherein z satisfies 2.5≤z≤3.3.

5. The phosphor according to claim 1, wherein u satisfies 0.001≤u≤0.8.

6. The phosphor according to claim 1, wherein z−u satisfies 2≤z−u.

7. The phosphor according to claim 1, wherein u+w satisfies 13.2≤u+w≤14.2.

8. The phosphor according to claim 1, further comprising at least one selected from Ba, Ca and Mg in an amount of 15 at. % or less of the total amount of M.

9. The phosphor according to claim 1, wherein the phosphor has at least 10 peaks at diffraction angles (2θ) of 15.05-15.15, 23.03-23.13, 24.87-24.97, 25.7-25.8, 25.97-26.07, 29.33-29.43, 30.92-31.02, 31.65-31.75, 31.88-31.98, 33.02-33.12, 33.59-33.69, 34.35-34.45, 35.2-35.3, 36.02-36.12, 36.55-36.65, 37.3-37.4, and 56.5-56.6 in an X-ray diffraction by Bragg-Brendano method using a Cu—Kα line.

10. A light-emitting device comprising:
a light-emitting element which emits light having an emission peak in a wavelength ranging from 250 to 500 nm; and
a luminous layer comprising a yellow-emitting phosphor comprising the phosphor of claim 1.

11. The light-emitting device according to claim 10, further comprising a heat-dissipative insulation substrate on which the light-emitting element is placed.

12. The light-emitting device according to claim 10, wherein the luminous layer further comprises a red-emitting phosphor.

13. The light-emitting device according to claim 12, wherein the luminous layer further comprises a green-emitting phosphor.

14. The light-emitting device according to claim 10, wherein the light-emitting element emits light having a wavelength of 250 to 400 nm.

15. A method for manufacturing a phosphor according to claim 1, the method comprising:
mixing a raw material for M selected from nitrides and carbides of M, a raw material for Al selected from nitrides, oxides and carbides of Al, a raw material for Si selected from nitrides, oxides and carbides of Si, and a raw material for Ce selected from oxides, nitrides and carbonates of Ce to obtain a mixture; and heating the mixture.

16. The method according to claim 15, wherein the mixture is heated at 1500 to 2000° C. under a pressure of 5 atmospheres or more.

17. The method according to claim 15, wherein the mixture is heated in a nitrogen atmosphere.

18. The method according to claim 15, further comprising washing the phosphor after heating.

19. The method according to claim 15, further comprising subjecting the phosphor washed to a post-annealing treatment in a reduction atmosphere.

20. The method according to claim 19, wherein the reduction atmosphere comprises nitrogen and hydrogen.

* * * * *